(12) United States Patent
Kang et al.

(10) Patent No.: US 10,186,191 B2
(45) Date of Patent: Jan. 22, 2019

(54) DISPLAY APPARATUS

(71) Applicant: Samsung Display Co., Ltd., Yongin-si, Gyeonggi-do (KR)

(72) Inventors: Kinyeng Kang, Yongin-si (KR); Jonghyun Choi, Yongin-si (KR); Sunkwang Kim, Yongin-si (KR); Suyeon Sim, Yongin-si (KR); Joosun Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 210 days.

(21) Appl. No.: 15/210,842

(22) Filed: Jul. 14, 2016

(65) Prior Publication Data

US 2017/0162111 A1 Jun. 8, 2017

(30) Foreign Application Priority Data

Dec. 2, 2015 (KR) .......................... 10-2015-0170668

(51) Int. Cl.
*G09G 3/3225* (2016.01)
*G09G 3/3233* (2016.01)
(Continued)

(52) U.S. Cl.
CPC ......... *G09G 3/3225* (2013.01); *G09G 3/3233* (2013.01); *H01L 27/326* (2013.01);
(Continued)

(58) Field of Classification Search
CPC .................... G09G 3/3225; G09G 2300/0439
See application file for complete search history.

(56) References Cited

U.S. PATENT DOCUMENTS

2006/0158588 A1* 7/2006 Uh .................. G02F 1/1333
349/114
2010/0328275 A1* 12/2010 Yamazaki .............. G09G 3/344
345/204

(Continued)

FOREIGN PATENT DOCUMENTS

EP 1672411 A2 6/2006
JP 2011-107250 A 6/2011

(Continued)

OTHER PUBLICATIONS

EPO Extended Search Report dated Nov. 16, 2016, for corresponding European Patent Application No. 16185776.8 (10 pages).

*Primary Examiner* — Andrew Sasinowski
(74) *Attorney, Agent, or Firm* — Lewis Roca Rothgerber Christie LLP

(57) ABSTRACT

A display apparatus includes a substrate, a display unit on the substrate and including a display region including a first display region having a plurality of first pixel circuits configured to drive a plurality of first light-emitting devices, and a second display region having a plurality of second pixel circuits configured to drive a plurality of second light-emitting devices, a plurality of scan lines crossing the display region in a first direction, and a plurality of data lines crossing the display region in a second direction, wherein resolutions of the first and second display regions are different, wherein a total number of the first light-emitting devices driven by one of the first pixel circuits is different from a total number of the second light-emitting devices driven by one of the second pixel circuits, and wherein the display unit and the substrate define at least one through portion in the second display region.

22 Claims, 12 Drawing Sheets

(51) Int. Cl.
   *H01L 51/52*     (2006.01)
   *H01L 27/32*     (2006.01)
(52) U.S. Cl.
   CPC ...... *H01L 27/3276* (2013.01); *H01L 51/5246* (2013.01); *H01L 51/5253* (2013.01); *G09G 2300/0426* (2013.01); *G09G 2300/0439* (2013.01); *G09G 2300/0819* (2013.01); *G09G 2310/0232* (2013.01); *G09G 2310/0262* (2013.01); *G09G 2340/0407* (2013.01)

(56) References Cited

U.S. PATENT DOCUMENTS

| | | | |
|---|---|---|---|
| 2015/0014650 A1 | 1/2015 | Lim et al. | |
| 2015/0144934 A1* | 5/2015 | Rappoport | G02B 27/01 257/40 |
| 2016/0011633 A1* | 1/2016 | Watanabe | G02F 1/1333 345/184 |
| 2017/0047544 A1 | 2/2017 | Kang et al. | |

FOREIGN PATENT DOCUMENTS

| | | |
|---|---|---|
| KR | 10-2007-0073105 A | 7/2007 |
| KR | 10-2017-0019553 | 2/2017 |
| WO | WO 2014/141893 A1 | 9/2014 |

* cited by examiner

DISPLAY APPARATUS

CROSS-REFERENCE TO RELATED PATENT APPLICATION

This application claims priority to, and the benefit of, Korean Patent Application No. 10-2015-0170668, filed on Dec. 2, 2015, in the Korean Intellectual Property Office, the disclosure of which is incorporated herein in its entirety by reference.

BACKGROUND

1. Field

One or more embodiments relate to a display apparatus.

2. Description of the Related Art

Applications of conventional display devices have diversified. Also, due to their relatively small thickness and light weight, the application range thereof has increased. In particular, flat panel display devices have been recently researched and manufactured.

Because display devices may be formed to be flat, various methods may be used to design display devices of different shapes, and the number of functions that may be applied or linked to the display devices has increased.

SUMMARY

One or more embodiments include a display apparatus including at least one through portion in a display region.

Additional aspects will be set forth in part in the description that follows and, in part, will be apparent from the description, or may be learned by practice of the presented embodiments.

According to one or more exemplary embodiments, a display apparatus includes a substrate, a display unit on the substrate and including a display region including a first display region having therein a plurality of first pixel circuits, and a plurality of first light-emitting devices configured to be driven by the plurality of first pixel circuits, and a second display region having therein a plurality of second pixel circuits, and a plurality of second light-emitting devices configured to be driven by the plurality of second pixel circuits, a plurality of scan lines crossing the display region in a first direction, and a plurality of data lines crossing the display region in a second direction that is different from the first direction, wherein resolutions of the first and second display regions are different, wherein a total number of the first light-emitting devices driven by one of the first pixel circuits is different from a total number of the second light-emitting devices driven by one of the second pixel circuits, and wherein the display unit and the substrate collectively define at least one through portion in the second display region.

The total number of the first light-emitting devices driven by the one of the first pixel circuits may be less than the total number of the second light-emitting devices driven by the one of the second pixel circuits.

A number of the first light-emitting device per unit area may be equal to a number of the second light-emitting devices per unit area.

The plurality of data lines may include a first data line disconnected at the at least one through portion in the second display region, and directly connected to the one of the second pixel circuits, and a second data line continuously extending over the first display region and the second display region, electrically connected to the first data line by a first connection line, and directly connected to the one of the first pixel circuits.

The plurality of data lines may further include a third data line aligned with the first data line, and separated from the first data line by the at least one through portion, the second data line and the third data line may be electrically connected to each other by a second connection line, and a same data signal may be applied to the first data line and the third data line.

The second data line may terminate at a boundary between the first display region and the second display region.

Each of the second pixel circuits may include a thin film transistor including an active layer, a gate electrode, a source electrode, and a drain electrode, and a storage capacitor including a second electrode, and a first electrode that includes the gate electrode of the thin film transistor, and the first connection line and the second connection line may be at a same layer as the gate electrode, the source electrode, the drain electrode, or the second electrode.

Each of the plurality of second light-emitting devices may include a pixel electrode, and an intermediate layer including an organic emission layer on the pixel electrode, at least two of the second light-emitting devices may be simultaneously driven by one second pixel circuit, and the pixel electrodes of the at least two second light-emitting devices may be electrically connected to each other.

The intermediate layers of the at least two second light-emitting devices may be configured to emit light having a same color.

The first pixel circuit may include a first thin film transistor, the second pixel circuit may include a second thin film transistor, and a magnitude of a driving current of the first thin film transistor may be different from a magnitude of a driving current of the second thin film transistor.

The display apparatus may further include a thin film encapsulation layer that encapsulates the display unit, and that includes at least one organic layer and at least one inorganic layer, the display unit may include a non-display region at an edge of the at least one through portion to surround the at least one through portion, and the thin film encapsulation layer may extend to the non-display region.

The display apparatus may further include a dam unit that surrounds the at least one through portion at the non-display region, an end of the organic layer may face or may contact a lateral surface of the dam unit facing the display region, the inorganic layer may cover the dam unit, and an end of the inorganic layer may be closer to the at least one through portion than to the dam unit.

The inorganic layer may contact a lateral surface of the substrate exposed by the at least one through portion.

According to one or more exemplary embodiments, a display apparatus includes a substrate, a display unit on the substrate, the substrate and the display unit collectively defining at least one through portion, and a thin film encapsulation layer that encapsulates the display unit, and that includes an organic layer and an inorganic layer, wherein the display unit includes a display region including first and second display regions having different resolutions, a non-display region at an edge of, and surrounding, the at least one through portion, and a dam unit within the non-display region and surrounding the at least one through portion, wherein the organic layer faces or contacts a lateral surface of the dam unit that faces the display region, and wherein the inorganic layer covers the dam unit, and contacts a lateral surface of the substrate exposed by the at least one through portion.

The display apparatus may further include a plurality of first pixel circuits, a plurality of first light-emitting devices configured to be driven by the plurality of first pixel circuits in the first display region, a plurality of second pixel circuits, and a plurality of second light-emitting devices configured to be driven by the plurality of second pixel circuits in the second display region, and a number of first light-emitting devices driven by one of the first pixel circuits may be less than a number of second light-emitting devices driven by one of the second pixel circuits.

The at least one through portion may be in the second display region.

The display unit may further include a plurality of scan lines crossing the display region in a first direction, and a plurality of data lines crossing the display region in a second direction that is different from the first direction, the plurality of data lines may include a first data line in the second display region and disconnected at the at least one through portion, and a second data line continuously extending over the first display region and the second display region, and the first data line and the second data line may be electrically connected to each other by a first connection line.

The first data line may be directly connected only to the one of the second pixel circuits, and the second data line may be directly connected only to the one of the first pixel circuits.

The plurality of data lines may further include a third data line aligned with the first data line, and separated from the first data line by the at least one through portion, the second data line and the third data line may be electrically connected to each other by a second connection line, and the second data line may terminate at a boundary between the first display region and the second display region.

Each of the plurality of second pixel circuits may include a thin film transistor including an active layer, a gate electrode, a source electrode, and a drain electrode, and the first connection line and the second connection line may be at a same layer as the active layer, the gate electrode, the source electrode, or the drain electrode.

Each of the plurality of second light-emitting devices may include a pixel electrode, and an intermediate layer including an organic emission layer on the pixel electrode, at least two of the plurality of second light-emitting devices may be simultaneously driven by one second pixel circuit, and the pixel electrodes of the at feast two second light-emitting devices may be electrically connected to each other.

The intermediate layers of the at least two second light-emitting devices may be configured to emit light having a same color.

The first pixel circuit may include a first thin film transistor, the second pixel circuit may include a second thin film transistor, and a magnitude of a driving current of the first thin film transistor may be different from a magnitude of a driving current of the second thin film transistor.

BRIEF DESCRIPTION OF THE DRAWINGS

These and/or other aspects will become apparent, and will be more readily appreciated, from the following description of the exemplary embodiments, taken in conjunction with the accompanying drawings, in which.

DETAILED DESCRIPTION

Figure 1:
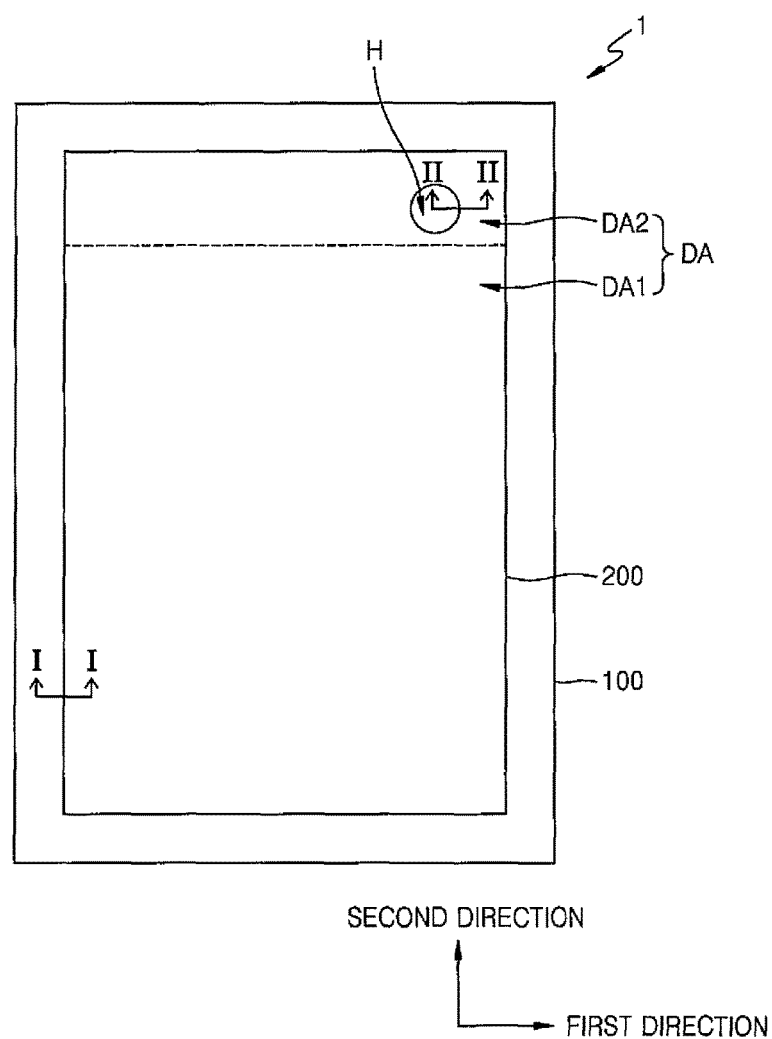
FIG. 1 is a schematic plan view of a display apparatus according to an embodiment of the present invention.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
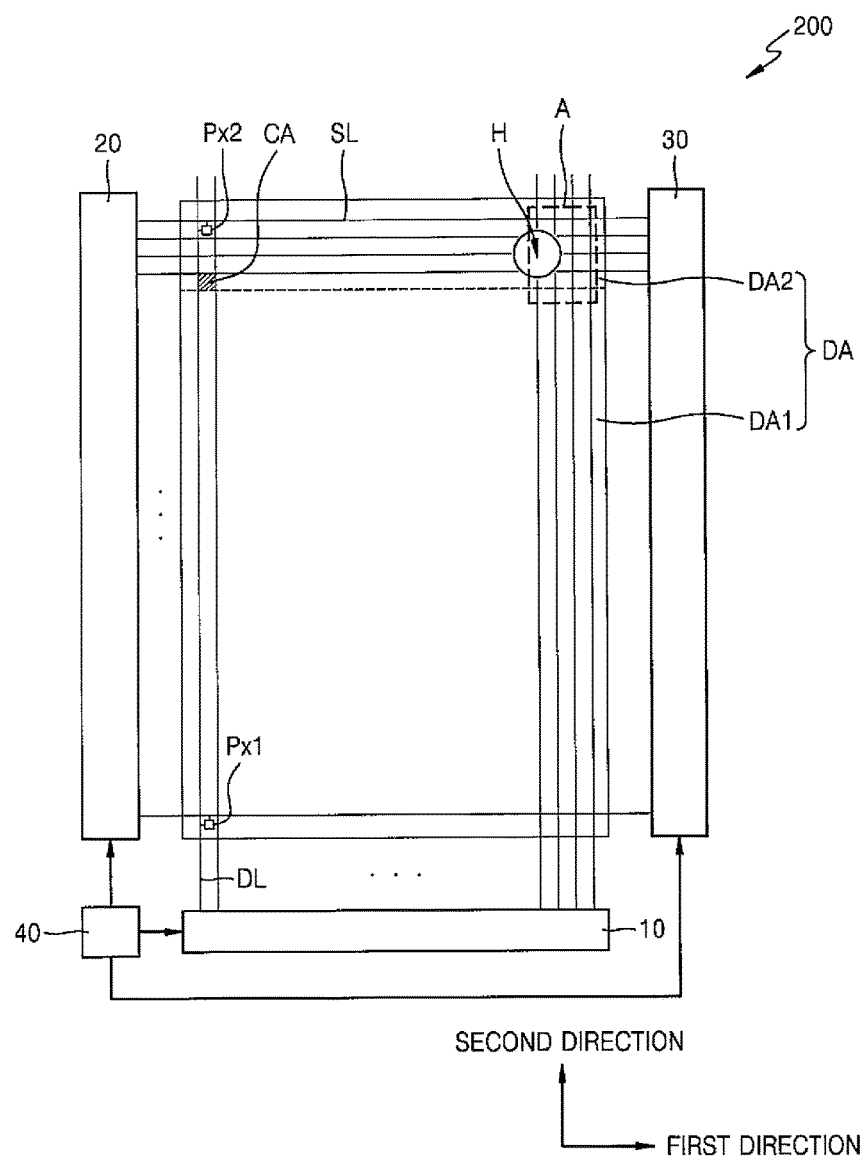
FIG. 2 is a schematic plan view of a display unit of the display apparatus of FIG. 1.

FIG. 1 is a schematic plan view of a display apparatus 1 according to an embodiment of the present invention, and FIG. 2 is a schematic plan view of a display unit 200 of the display apparatus 1 of FIG. 1.

Referring to FIGS. 1 and 2, the display apparatus 1 may include a substrate 100, the display unit 200 on the substrate 100, and at least one through portion H penetrating through the display unit 200 and the substrate 100.

The display unit 200 may include a display region DA where an image is realized, a plurality of scan lines SL that cross the display region DA in a first direction, and a plurality of data lines DL that cross the display region DA in a second direction that is different from the first direction. For example, the first direction and the second direction may be perpendicular to each other. A plurality of pixels Px1 and Px2 may be respectively positioned at crossing regions CA of the plurality of data lines DL and the plurality of scan lines SL.

For example, the plurality of scan lines SL may transmit scan signals, which are received from a first scan driving unit 20 and from a second scan driving unit 30, to the plurality of pixels Px1 and Px2. For example, some of the plurality of scan lines SL may receive a scan signal from the first scan driving unit 20, and the remaining ones of the plurality of scan lines SL may receive a scan signal from the second scan driving unit 30. The first scan driving unit 20 and the second scan driving unit 30 may be synchronized with each other by a synchronized clock signal.

The plurality of data lines DL may receive a data signal from a data driving unit 10, and may transmit the data signal to the plurality of pixels Px1 and Px2.

A controller 40 may change an externally-received image signal to an image data signal, and may transmit the image data signal to the data driving unit 10. The controller 40 may receive a synchronization signal and a clock signal to generate control signals for controlling the first scan driving unit 20, the second scan driving unit 30, and the data driving unit 10, and may respectively transmit the control signals to the first scan driving unit 20, the second scan driving unit 30, and the data driving unit 10.

The display region DA may include a first display region DA1 and a second display region DA2 having different resolutions. The first pixels Px1 may be positioned in the first display region DA1. The second pixels Px2 may be positioned in the second display region DA2. For example, the resolution of the first display region DA1 may be higher than that of the second display region DA2. In other words, in separate identically sized areas of the first and second display regions DA1 and DA2, the number of first pixels Px1 may be higher than that of second pixels Px2.

The at least one through portion H may be positioned within the second display region DA2. A camera, a sensor, and the like may be mounted in the at least one through portion H. The at least one through portion H may be a space for an extra member for a function of the display apparatus 1, or for an extra member capable of adding a new function to the display apparatus 1. The second display region DA2 and the at least one through portion H are not limited to the example shown in FIG. 1. In other words, the second display region DA2 may be at any of various places, such as a center portion or a lower portion of the display region DA, and the second display region DA2 may also be set to have various sizes. The at least one through portion H need not be circular, and may instead have various shapes, such as a triangular or polygonal shape. Further, the shape, size, and location of the at least one through portion H may vary. For example, the at least one through portion H may be adjacent the first display region DA. For example, the second display region DA2 may partially surround the through portion H. Thus, in plan view, the through portion H may extend up to the edge of the substrate 100.

Because some of the plurality of data lines DL and the plurality of scan lines SL overlap the at least one through portion H, a disconnection in the data lines DL and the scan lines SL occurs due to the at least one through portion H. Because the plurality of scan lines SL receive the scan signals from both of the first scan driving unit 20 and the second scan driving unit 30, which are located on opposite sides of the display unit 200, the plurality of scan lines SL are not affected by the disconnection due to the at least one through portion H. However, when a data line DL is disconnected due to the at least one through portion H, a data signal is not transmitted to the second pixels Px2 located on the side of the at least one through portion H that is opposite the data driving unit 10, and thus the quality of the second display region DA2 may degrade.

To address this problem, a data line DL that overlaps the through portion H may have a curved shape to avoid the through portion H. However, when the data line DL has the curved shape and is located along an exterior circumference of the through portion H, an additional space may be used to dispose the data line DL having the curved shape around the through portion H. Thus, the area of a non-display region NDA' around the through portion H may increase (e.g., see FIG. 8).

However, according to the present embodiment, because some of the plurality of data lines DL are not directly connected to the second pixels Px2 in the second display region DA2, a data line DL disconnected due to the through portion H may be connected to another data line DL that is not directly connected to the second pixels Px2 by a first connection line CL1 (e.g., see FIG. 5), and may receive a data signal.

Accordingly, because a pre-existing data line DL is used as a passage for avoiding the through portion H, the area of the non-display region NDA' around the through portion H (e.g., see FIG. 8) may be reduced or minimized, and manufacturing efficiency of the display apparatus 1 may improve. This will be described later in more detail with reference to FIG. 5.

Figure 3:
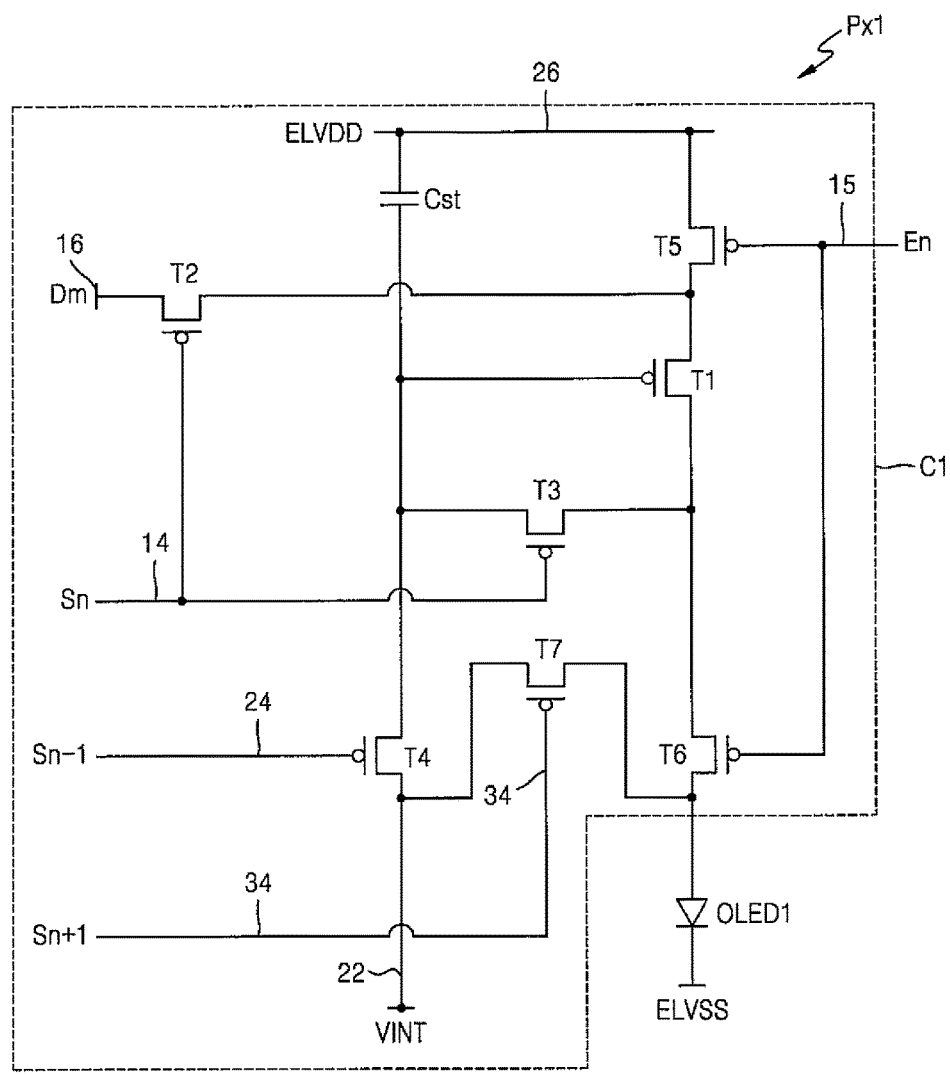
FIG. 3 is a circuit diagram of an example of an equivalent circuit of a first pixel included in a first display region of the display unit of FIG. 2.
Figure 4:
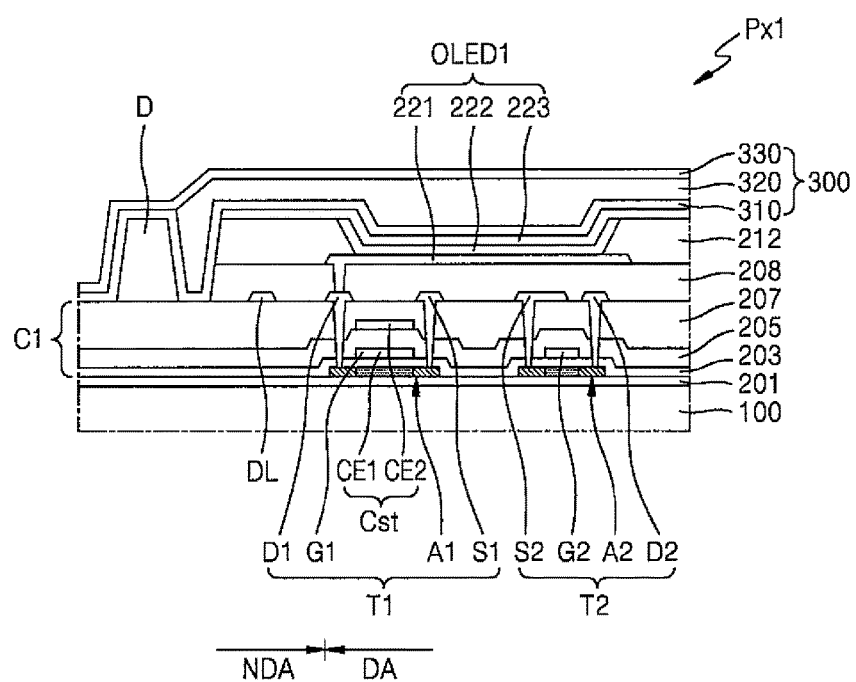
FIG. 4 is a cross-sectional view taken along the line I-I of FIG. 1.

FIG. 3 is a circuit diagram of an example of an equivalent circuit of a first pixel Px1 included in the first display region DA1 of the display unit 200 of FIG. 2, and FIG. 4 is a cross-sectional view taken along the line I-I FIG. 1.

Referring to FIG. 3, the first pixel Px1 may include a first pixel circuit C1 and a first light-emitting device OLED1. The first light-emitting device OLED1 may emit red light, green light, blue light, or white light.

For example, the first pixel circuit C1 may include a plurality of thin film transistors T1-T7 and at least one storage capacitor Cst. The first pixel circuit C1 may be electrically connected to the first light-emitting device OLED1. The first light-emitting device OLED1 may receive a driving current via the first pixel circuit C1, and may emit light.

The plurality of thin film transistors T1-T7 may include a driving thin film transistor T1, a switching thin film transistor T2, a compensating thin film transistor T3, a first initializing thin film transistor T4, a first light-emission control thin film transistor T5, a second light-emission control thin film transistor T6, and a second initializing thin film transistor T7.

The first pixel circuit C1 may include a first scan line 14 for transmitting a first scan signal Sn to the switching thin film transistor T2 and to the compensating thin film transistor T3. The first pixel circuit C1 may also include a second scan line 24 for transmitting a second scan signal Sn−1 to the first initializing thin film transistor T4, a third scan line 34 for transmitting a third scan signal Sn+1 to the second initializing thin film transistor T7, a light-emission control line 15 for transmitting a light-emission control signal En to the first light-emission control thin film transistor T5 and to the second light-emission control thin film transistor T6, a data line 16 for transmitting a data signal Dm, a driving voltage line 26 for transmitting a first power supply voltage ELVDD, and an initializing voltage line 22 for transmitting an initializing voltage VINT for initializing the driving thin film transistor T1.

A drain electrode of the driving thin film transistor T1 may be electrically connected to the first light-emitting device OLED1 via the second light-emission control thin film transistor T6. The driving thin film transistor T1 may receive the data signal Dm according to a switching operation of the switching thin film transistor T2, and may supply the driving current to the first light-emitting device OLED1.

A gate electrode of the switching thin film transistor T2 may be connected to the first scan line 14. A source electrode of the switching thin film transistor T2 may be connected to the data line 16. A drain electrode of the switching thin film transistor T2 may be connected to a source electrode of the driving thin film transistor T1, and may also be connected to the driving voltage line 26 via the first light-emission control thin film transistor T5.

The switching thin film transistor T2 is configured to be turned on according to the first scan signal Sn received via the first scan line 14, and is configured to perform a switching operation for transmitting the data signal Dm received from the data line 16 to the source electrode of the driving thin film transistor T1.

A gate electrode of the compensating thin film transistor T3 may be connected to the first scan line 14. A source electrode of the compensating thin film transistor T3 may be connected to the drain electrode of the driving thin film transistor T1, and may also be connected to a pixel electrode 221 (see FIG. 4) of the first light-emitting device OLED1 via the second light-emission control thin film transistor T6. A drain electrode of the compensating thin film transistor T3 is connected to a first electrode CE1 (see FIG. 4) of the storage capacitor Cst, a source electrode of the first initializing thin film transistor T4, and the gate electrode of the driving thin film transistor T1. The compensating thin film transistor T3 is configured to be turned on in response to the first scan signal Sn received via the first scan line 14, and is configured to connect the gate electrode of the driving thin film transistor T1 to the drain electrode of the driving thin film transistor T1, such that the driving thin film transistor T1 is diode-connected.

A gate electrode of the first initializing thin film transistor T4 may be connected to the second scan line 24. A drain electrode of the first initializing thin film transistor T4 may be connected to the initializing voltage line 22. The source electrode of the first initializing thin film transistor T4 may be connected to the first electrode CE1 (see FIG. 4) of the storage capacitor Cst, to the drain electrode of the compensating thin film transistor T3, and to the gate electrode of the driving thin film transistor T1. The first initializing thin film transistor T4 may be turned on according to the second scan signal Sn−1 received via the second scan line 24, and may transmit the initializing voltage VINT to the gate electrode of the driving thin film transistor T1 to thereby perform an initialization operation by initializing a voltage of the gate electrode of the driving thin film transistor T1.

A gate electrode of the first light-emission control thin film transistor T5 may be connected to the light-emission control line 15. A source electrode of the first light-emission control thin film transistor T5 may be connected to the driving voltage line 26. A drain electrode of the first light-emission control thin film transistor T5 is connected to the source electrode of the driving thin film transistor T1, and to the drain electrode of the switching thin film transistor T2.

A gate electrode of the second light-emission control thin film transistor T6 may be connected to the light-emission control line 15. A source electrode of the second light-emission control thin film transistor T6 may be connected to the drain electrode of the driving thin film transistor T1 and to the source electrode of the compensating thin film transistor T3. A drain electrode of the second light-emission control thin film transistor T6 may be electrically connected to the pixel electrode 221 (see FIG. 4) of the first light-emitting device OLED1. The first light-emission control thin film transistor T5 and the second light-emission control thin film transistor T6 are configured to be simultaneously turned on according to the light-emission control signal En received via the light-emission control line 15, and thus the first power supply voltage ELVDD is able to be transmitted to the first light-emitting device OLED1 when the driving current flows in the first light-emitting device OLED1.

A gate electrode of the second initializing thin film transistor T7 may be connected to the third scan line 34. A source electrode of the second initializing thin film transistor T7 may be connected to the pixel electrode 221 (see FIG. 4) of the first light-emitting device OLED1. A drain electrode of the second initializing thin film transistor T7 may be connected to the initializing voltage line 22. The second initializing thin film transistor T7 may be turned on according to the third scan signal Sn+1 received via the third scan line 34, and may initialize the pixel electrode 221 of the first light-emitting device OLED1.

A second electrode CE2 (see FIG. 4) of the storage capacitor Cst may be connected to the driving voltage line 26. The first electrode CE1 (see FIG. 4) of the storage capacitor Cst may be connected to the gate electrode of the driving thin film transistor T1, to the drain electrode of the compensating thin film transistor T3, and to the source electrode of the first initializing thin film transistor T4.

An opposite electrode 223 (see FIG. 4) of the first light-emitting device OLED1 may be connected to a second power supply voltage ELVSS. The first light-emitting device OLED1 may receive a driving current from the driving thin film transistor T1, and may emit light.

FIG. 3 illustrates an example of a circuit that drives the first pixel Px1, and the first light-emitting device OLED1 may be operated by various other circuit structures.

Because FIG. 4 is a cross-sectional view schematically illustrating a cross-section of the first pixel Px1, FIG. 4 illustrates a first pixel circuit C1 including the driving thin film transistor T1, the switching thin film transistor T2, and the storage capacitor Cst, for convenience of explanation.

Referring to FIG. 4, the substrate 100 may include various materials. For example, the substrate 100 may be formed of a glass material containing $SiO_2$ as a main component. However, the material used to form the substrate 100 is not limited thereto, and the substrate 100 may be formed of a plastic material. The plastic material may be polyethersulphone (PES), polyacrylate (PAR), polyetherimide (PEI), polyethyelenen napthalate (PEN), polyethyelenenterepthalate (PET), polyphenylene sulfide (PPS), polyallylate, polyimide, polycarbonate (PC), cellulose triacetate (TAC), cellulose acetate propionate (CAP), cyclic olefin polymer, cyclic olefin copolymer, or the like.

A buffer layer 201 is formed on the substrate 100. The buffer layer 201 may reduce or prevent infiltration of a foreign material, moisture, or ambient air from below the substrate 100, and may provide a flat surface on the substrate 100. The buffer layer 201 may include an inorganic material (such as oxide or nitride), an organic material, or an organic and inorganic compound, and may be formed as a single layer or as multiple layers of inorganic and organic material.

A first thin film transistor T1 may be a driving thin film transistor, and may include an active layer A1, a gate electrode G1, a source electrode S1, and a drain electrode D1. A second thin film transistor T2 may be a switching thin film transistor, and may include an active layer A2, a gate electrode G2, a source electrode S2, and a drain electrode D2.

Although FIG. 4 illustrates an example in which the first thin film transistor T1 and the second thin film transistor T2 are top gate type thin film transistors, in which the gate electrodes G1 and G2 thereof are respectively on the active layers A1 and A2 with a gate insulating layer 203 interposed therebetween, embodiments of the present invention are not limited thereto, and the first thin film transistor T1 and the second thin film transistor T2 may be bottom gate type thin film transistors.

The active layers A1 and A2 of the first thin film transistor T1 and the second thin film transistor T2 may include amorphous silicon or polycrystalline silicon. According to another embodiment, the active layers A1 and A2 may include oxide of at least one selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The active layers A1 and A2 may include a channel region, and may also include a source region and a drain region doped with impurities.

The gate insulating layer 203 may be on the active layers A1 and A2. The gate insulating layer 203 may include an inorganic material including oxide or nitride. For example, the gate insulating layer 203 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The gate electrodes G1 and G2 respectively of the first thin film transistor T1 and the second thin film transistor T2 may be positioned on the gate insulating layer 203. The gate electrodes G1 and G2 may include a low resistance metal material. For example, the gate electrodes G1 and G2 may include molybdenum (Mo), aluminum (Al), copper (Cu), and titanium (Ti), and may be formed as a single layer or as a multi-layer.

The gate electrode G1 of the first thin film transistor T1 may also form the first electrode CE1 of the storage capacitor Cst.

A first interlayer insulating layer 205 on the gate electrodes G1 and G2 may include an inorganic material including oxide or nitride. For example, the first interlayer insulating layer 205 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The second electrode CE2 of the storage capacitor Cst is positioned on the first interlayer insulating layer 205 to overlap the first electrode CE1. Because the first electrode CE1 is the gate electrode G1 of the first thin film transistor T1, the storage capacitor Cst may be positioned to overlap the first thin film transistor T1.

The second electrode CE2 may include a conductive material including molybdenum (Mo), aluminum (Al), copper (Cu), and titanium (Ti), and may be formed as a multi-layer or as a single layer including the aforementioned materials.

A second interlayer insulating layer 207 is positioned on the second electrode CE2, and the source electrodes S1 and S2 and the drain electrodes D1 and D2 respectively of the first thin film transistor T1 and the second thin film transistor T2 are positioned on the second interlayer insulating layer 207.

For example, the second interlayer insulating layer 207 may include silicon oxide ($SiO_x$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The source electrodes S1 and S2 and the drain electrodes D1 and D2 of the first thin film transistor T1 and the second thin film transistor T2 may include a highly-conductive material. For example, each of the source electrodes S1 and S2 and the drain electrodes D1 and D2 may include a conductive material including molybdenum (Mo), aluminum (Al), copper (Cu), and titanium (Ti), and may be formed as a multi-layer or as a single layer including the aforementioned materials. For example, each of the source electrodes S1 and S2 and the drain electrodes D1 and D2 may be formed as a multi-layer of Ti/Al/Ti. A data line DL may be formed on the same layer as a layer on which the source electrodes S1 and S2 and the drain electrodes D1 and D2 are formed.

The source electrodes S1 and S2 and the drain electrodes D1 and D2 may respectively contact source regions and drain regions of the active layers A1 and A2 via contact holes.

A planarization layer 208 may be positioned on the source electrodes S1 and S2 and the drain electrodes D1 and D2, and the first light-emitting device OLED1 may be positioned on the planarization layer 208.

The planarization layer 208 may be a single layer including an organic material layer or including a multi-layer formed by stacking single layers including an organic material. The organic material may include a commercial polymer, such as polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The planarization layer 208 may be a stack of an inorganic insulation layer and an organic insulation layer.

The first light-emitting device OLED1 may include the pixel electrode 221, the opposite electrode 223, and an intermediate layer 222 between the pixel electrode 221 and the opposite electrode 223.

The pixel electrode 221 may be electrically connected to the drain electrode D1 of the first thin film transistor T1 via the second light-emission control thin film transistor T6 of FIG. 3. The pixel electrode 221 may have various shapes. For example, the pixel electrode 221 may be patterned to have an island shape.

For example, the pixel electrode 221 may be a reflection electrode. For example, the pixel electrode 221 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and may include a transparent or semi-transparent electrode layer on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and/or aluminum zinc oxide (AZO).

A pixel defining layer 212 is formed of an insulating material partially located on the pixel electrode 221. The pixel defining layer 212 may include at least one organic insulating material selected from the group consisting of polyimide, polyamide (PA), acryl resin, benzocyclobutene (BCB) and a phenolic resin, by using a method such as spin coating. The pixel defining layer 212 exposes an area of the pixel electrode 221. The intermediate layer 222 including an organic emission layer is positioned on the exposed area of the pixel electrode 221.

The organic emission layer included in the intermediate layer 222 may include a low molecular organic material or of a high molecular organic material, and the intermediate layer 222 may further include one or more functional layers, such as a hole transport layer (HTL), an hole injection layer (HIL), an electron transport layer (ETL), and/or an electron injection layer (EIL), in addition to the organic emission layer.

The opposite electrode 223 may be a transparent or semi-transparent electrode, and may include a metal thin film having a small work function, including Li, Ca, LiF/Ca, LiF/Al, Al, Ag, Mg, or a combination thereof. An auxiliary electrode layer or a bus electrode may include a transparent electrode forming material, such as ITO, IZO, ZnO, or $In_2O_3$, on the metal thin film. Accordingly, the opposite electrode 223 may transmit light emitted by the organic emission layer included in the intermediate layer 222. In other words, the light emitted by the organic emission layer may travel directly toward the opposite electrode 223, or may be reflected by the pixel electrode 221 and then travel toward the opposite electrode 223.

A thin film encapsulation layer 300 is on the opposite electrode 223. The thin film encapsulation layer 300 may entirely cover the display unit 200 to prevent external oxygen and moisture from permeating the display unit 200.

The thin film encapsulation layer 300 may include at least one organic layer (e.g., an organic layer 320), and may include at least one inorganic layer (e.g., inorganic layers 310 and 330). The organic layer 320 and the inorganic layers 310 and 330 may be alternately stacked one on another. Although the thin film encapsulation layer 300 includes the two inorganic layers 310 and 330 and the single organic layer 320 in FIG. 4, embodiments of the present invention are not limited thereto. In other words, the thin film encapsulation layer 300 may further include a plurality of additional inorganic layers and a plurality of additional organic layers that are alternately stacked one on another, and the number of inorganic layers stacked and the number of organic layers stacked are not limited.

The inorganic layers 310 and 330 may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON).

The organic layer 320 may planarize steps caused by the pixel defining layer 212, and may reduce stresses generated on the inorganic layers 310 and 330. The organic layer 320 may include PMMA, PC, PS, acryl-based resin, epoxy-based resin, polyimide, and/or polyethylene.

The inorganic layers 310 and 330 may have larger areas than the organic layer 320. Thus, the inorganic layers 320 and 330 may contact each other at an edge of the organic layer 320, and accordingly, permeation of external oxygen or moisture may be effectively prevented.

The display apparatus 1 may further include a dam unit D surrounding the display region DA, and located in a non-display region NDA around the display region DA.

During formation of the organic layer 320 of the thin film encapsulation layer 300, the dam unit D may block an organic material used to form the organic layer 320 from flowing toward an edge of the substrate 100, thereby preventing formation of an edge tale of the organic layer 320. The dam unit D may surround the display region DA.

The dam unit D may include the same material used to form at least one of the planarization layer 208 and the pixel defining layer 212. For example, the dam unit D may include a first layer including the material used to form the planarization layer 208, and may include a second layer including the material used to form the pixel defining layer 212. However, embodiments of the present invention are not limited thereto, and the dam unit D may include a single layer. A plurality of dam units D may be included. When a plurality of dam units D is included, each of the dam units D has a height increasing in a direction toward the edge of the substrate 100.

Figure 5:
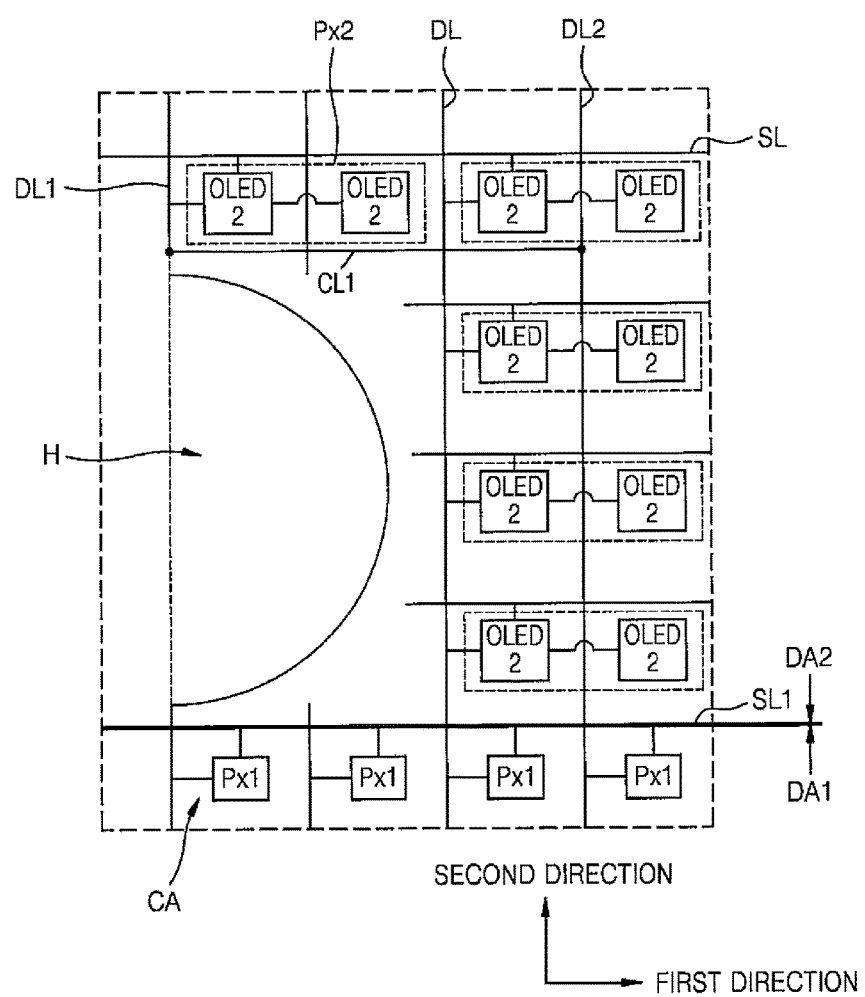
FIG. 5 is a magnified plan view of an example of the portion A of FIG. 2.
Figure 6:
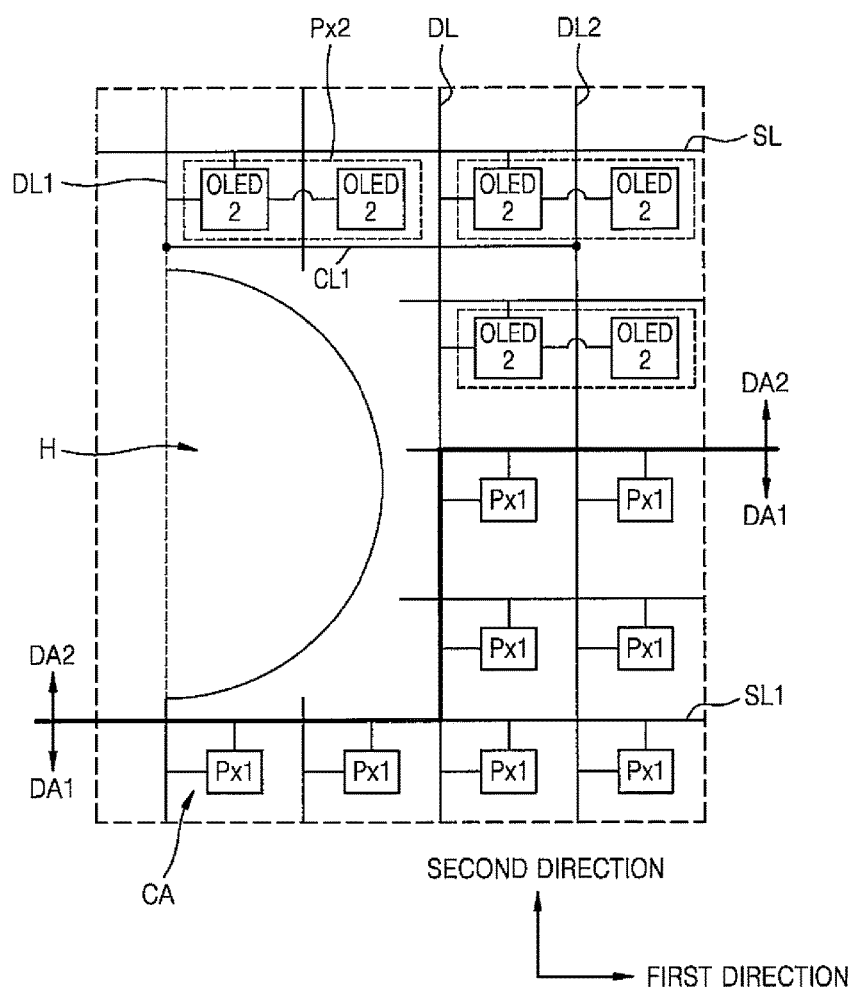
FIG. 6 is a magnified plan view of another example of the portion A of FIG. 2.
Figure 7:
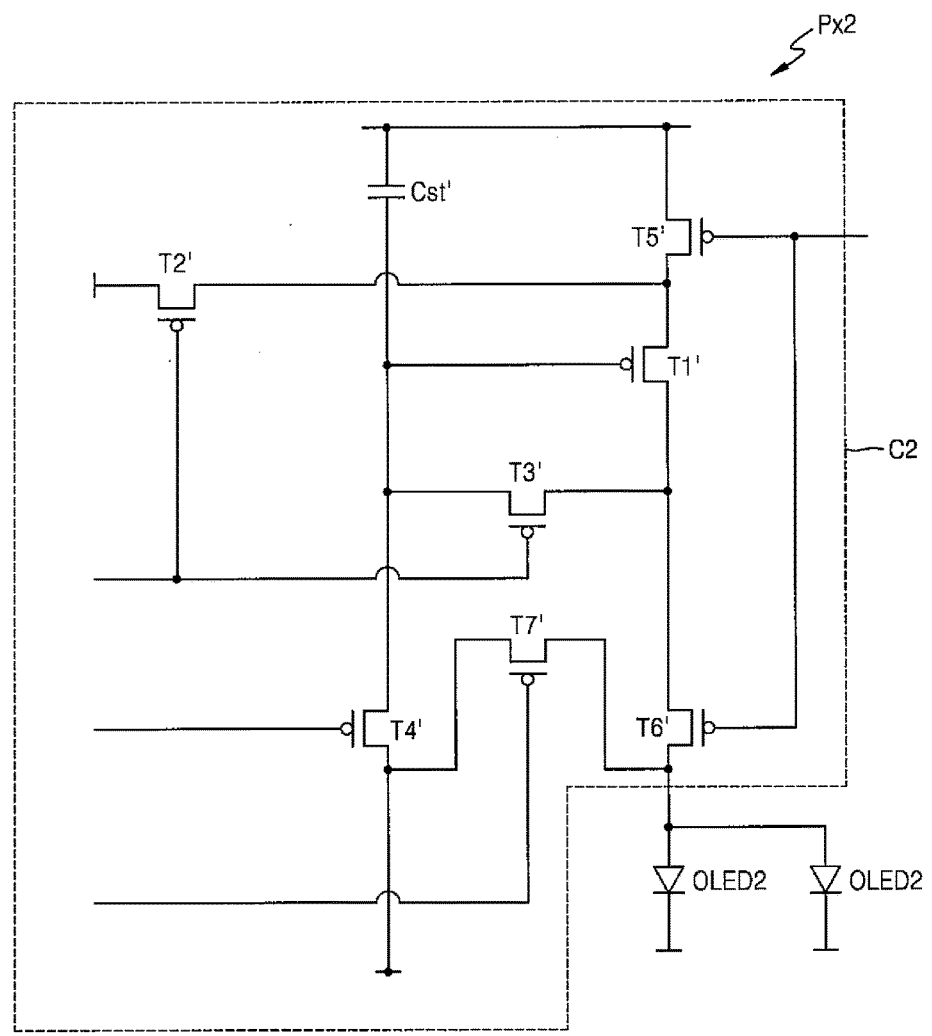
FIG. 7 is a circuit diagram of an example of an equivalent circuit of a second pixel included in a second display region of the display unit of FIG. 2.
Figure 8:
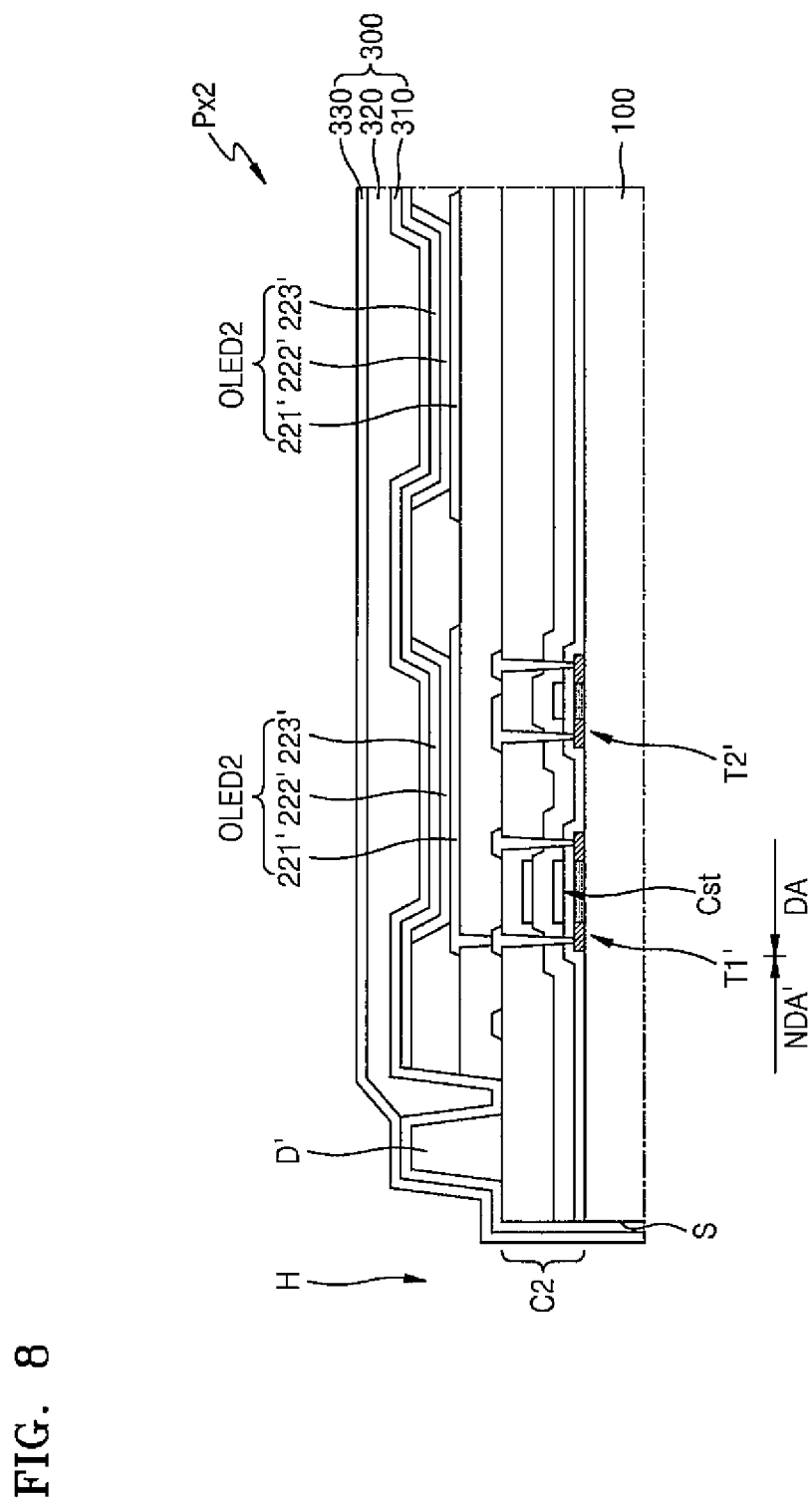
FIG. 8 is a cross-sectional view taken along the line II-II of FIG. 1.

FIG. 5 is a magnified plan view of an example of the portion A of FIG. 2, FIG. 6 is a magnified plan view of another example of the portion A of FIG. 2, FIG. 7 is a circuit diagram of an example of an equivalent circuit of a second pixel Px2 included in the second display region DA2 of the display unit 200 of FIG. 2, and FIG. 8 is a cross-sectional view taken along the line II-II of FIG. 1.

Referring to FIGS. 2-5, the display region DA may include the first display region DA1 and the second display region DA2 having different resolutions.

The first display region DA1 may be defined as a region where the first pixels Px1 are consecutively arranged in a first direction that is parallel to the plurality of scan lines SL, and in a second direction that is parallel to the plurality of data lines DL, and are arranged among the crossing regions CA between the plurality of data lines DL and the plurality of scan lines SL. The second display region DA2 may be defined as the remaining region.

As described above, because each of the first pixels Px1 includes the first pixel circuit C1 of FIG. 3 and the first light-emitting device OLED1 of FIG. 3, the first display region DA1 may be defined as a region where the first pixel circuits C1 of FIG. 3 are consecutively arranged in the first direction and in the second direction among the crossing regions CA between the plurality of data lines DL and the plurality of scan lines SL.

For example, as shown in FIG. 2, when the second display region DA2 covers entirely one side (e.g., an upper side) of the display region DA in a direction parallel to the scan lines SL, the first display region DA1 and the second display region DA2 may be defined by a first scan line SL1, which is connected to all of the first pixel circuits C1 of FIG. 3 at the crossing regions CA between the first scan line SL1 and the plurality of data lines DL, and which is closest to the at least one through portion H. In other words, the crossing regions CA between the first scan line SL1 and the plurality of data lines DL may be, or may be at, an edge of the first display region DA1, and accordingly the first display region DA1 and the second display region DA2 may be divided by the first scan line SL1.

However, embodiments of the present invention are not limited thereto, and the first display region DA1 and the second display region DA2 may be divided in various forms. As another example, as shown in FIG. 6, crossing regions CA in which the first pixels Px1 are consecutively arranged in the first direction may also extend in the second direction around the through portion H. Accordingly, a boundary between the first display region DA1 and the second display region DA2 may have a step shape in a plan view, and the first display region DA1 may have a shape that surrounds a portion of the through portion H.

The resolution of the second display region DA2 may be lower than that of the first display region DA1. The second display region DA2 includes a plurality of second pixels Px2, and each of the plurality of second pixels Px2 may include one second pixel circuit C2 (see FIG. 7), and may include a plurality of second light-emitting devices OLED2. Referring to FIGS. 5 and 6, more second pixels Px2 may be arranged between the first scan line SL1 and the through portion H.

In the second display region DA2, some of the plurality of data lines DL are not directly connected to the second pixels Px2. Thus, no second pixel circuits C2 of FIG. 7 are in some of the crossing regions CA between the plurality of data lines DL and the plurality of scan lines SL. Accordingly, the number of second pixel circuits C2 of FIG. 7 per unit area is smaller than the number of first pixel circuits C1 of FIG. 3 per unit area.

However, the first light-emitting devices OLED1 of FIG. 4 included in the first display region DA1 and in the second light-emitting devices OLED2 included in the second display region DA2 may be formed equally. In other words, the number of first light-emitting devices OLED1 of FIG. 3 per unit area may be equal to that of second light-emitting devices OLED2, and thus the number of first light-emitting devices OLED1 of FIG. 3 driven by one first pixel circuit C1 of FIG. 3 may be different from that of second light-emitting devices OLED2 driven by one second pixel circuit C2 of FIG. 7.

For example, FIG. 5 illustrates an example in which one second pixel Px2 includes two second light-emitting devices OLED2. However, a first pixel Px1 includes one first light-emitting device OLED1 of FIG. 3. Thus, the number of first light-emitting devices OLED1 of FIG. 3 driven by one first pixel circuit C1 of FIG. 3 is less than that of second light-emitting devices OLED2 driven by one second pixel circuit C2 of FIG. 7, and consequently, within identically sized areas, the number of second pixels Px2 is less than that of first pixels Px1. Thus, resolution of the second display region DA2 may be lower than that of the first display region DA1. In the second display region DA2, one scan signal may be used for two scan lines SL.

Two or more second light-emitting devices OLED2 connected to one second pixel circuit C2 of FIG. 7 may be simultaneously driven. This will be described later in more detail with reference to FIGS. 7 and 8.

Referring to FIGS. 5 and 6, the plurality of data lines DL may include a first data line DL1 disconnected by at least one through portion H, and positioned within the second display region DA2, and may also include a second data line DL2 continuously extending over the first display region DA1 and the second display region DA2. Although FIGS. 5 and 6 illustrate one first data line DL1 and one second data line DL2 for convenience of explanation, it should be understood that a plurality of first data lines DL1 and/or a plurality of second data lines DL2 may be included.

The first data line DL1 is connected to a second pixel Px2. On the other hand, the second data line DL2 may be connected to first pixels Px1 within the first display region DA1, and might not be connected to any second pixel Px2 within the second display region DA2.

Within the second display region DA2, the first data line DL1 may be electrically connected to the second data line DL2 by a first connection line CL1. Accordingly, the data signal applied to the second data line DL2 may be equally applied to the first data line DL1, and the second pixel Px2 connected to the first data line DL1 may be normally driven.

The first connection line CL1 may be on the same layer as the gate electrodes G1 and G2 of FIG. 4, the same layer as the source and drain electrodes S1, S2, D1, and D2 of FIG. 4, or the same layer as the second electrode CE2 of the storage capacitor Cst. Accordingly, because an additional process for forming the first connection line CL1 is not necessary, and because the pre-existing second data line DL2 is used as a passage for avoiding the through portion H, the area of the non-display region NDA' of FIG. 8 around the through portion H may be reduced or minimized, and manufacturing efficiency of the display apparatus 1 may improve.

The first connection line CL1 may cross over the display region DA, or may have a length necessary for connecting the first data line DL1 to the second data line DL2. The second data line DL2 may also elongate in the second direction, or may have only sufficient length for connection with the first connection line CL1.

FIG. 7 illustrates an equivalent circuit of a second pixel Px2 of FIG. 5, and FIG. 8 illustrates a schematic cross-section of the second pixel Px2 of FIG. 5. Although FIGS. 5, 7, and 8 illustrate, for convenience of explanation, an example in which one second pixel Px2 includes two second light-emitting devices OLED2, embodiments of the present invention are not limited thereto, and one second pixel Px2 may include three or more second light-emitting devices OLED2 that may be simultaneously driven.

The second pixel circuit C2 may be the same as the first pixel circuit C1 of FIG. 3. In other words, the second pixel circuit C2 may include a driving thin film transistor T1', a switching thin film transistor T2', a compensating thin film transistor T3', a first initializing thin film transistor T4', a first light-emission control thin film transistor T5', a second light-emission control thin film transistor T6', a second initializing thin film transistor T7', and at least one storage capacitor Cst'.

The driving thin film transistor T1' may be electrically connected to the second light-emitting devices OLED2 via the second light-emission control thin film transistor T6' to supply a driving current. Pixel electrodes 221' (see FIG. 8) of the second light-emitting devices OLED2 may be connected to each other.

The magnitude of the driving current flowing in the second pixel circuit C2 may be different from that of the driving current flowing in the first pixel circuit C1 of FIG. 3. In other words, because the second pixel circuit C2 needs to simultaneously drive two or more second light-emitting devices OLED2, a driving current that is greater than the driving current flowing in the first pixel circuit C1 of FIG. 3 may flow in the second pixel circuit C2.

To this end, for example, channels of the plurality of thin film transistors T1'-T7' included in the second pixel circuit C2 may be wider than those of the plurality of thin film transistor T1-T7 included in the first pixel circuit C1 of FIG. 3. Alternatively, the channels of the plurality of thin film transistors T1'-T7' included in the second pixel circuit C2 may be shorter than those of the plurality of thin film transistor T1-T7 included in the first pixel circuit C1 of FIG. 3. Alternatively, the channels of the plurality of thin film transistors T1'-T7' included in the second pixel circuit C2 may include a material having a greater charge mobility than a material used to form the channels of the plurality of thin film transistor T1-T7 included in the first pixel circuit C1 of FIG. 3. Alternatively, the gate insulating layer 203 of FIG. 4 positioned on the channels of the plurality of thin film transistors T1'-T7' included in the second pixel circuit C2 may be thinner than that positioned on the channels of the plurality of thin film transistor T1-T7 of FIG. 3 included in the first pixel circuit C1 of FIG. 3.

FIG. 8 illustrates a second pixel circuit C2 including only the driving thin film transistor T1', the switching thin film transistor T2', and the storage capacitor Cst' for convenience of explanation. The driving thin film transistor T1', the switching thin film transistor T2', and the storage capacitor Cst' may be the same as the driving thin film transistor T1, the switching thin film transistor T2, and the storage capacitor Cst of FIG. 4, respectively. However, a larger current may flow in a channel of the driving thin film transistor T1' than the current flowing in the channel of the driving thin film transistor T1 of FIG. 4.

Each of the two second light-emitting devices OLED2 may include the pixel electrode 221', an opposite electrode 223', and an intermediate layer 222' between the pixel electrode 221' and the opposite electrode 223'.

The pixel electrodes 221' of the two second light-emitting devices OLED2 may be electrically connected to each other so that the two second light-emitting devices OLED2 may be simultaneously driven by the single second pixel circuit C2. When the two second light-emitting devices OLED2 are adjacent each other, the pixel electrodes 221' of the two second light-emitting devices OLED2 may be integrally formed with each other.

Alternatively, the pixel electrodes 221' of the two second light-emitting devices OLED2 may be electrically connected to each other by an additional line. The additional line may be formed at the same layer as the active layers A1 and A2, the gate electrodes G1 and G2, the source and drain electrodes S1, S2, D1, and D2, or the second electrode CE2 of the storage capacitor Cst of FIG. 4.

The intermediate layers 222' of the two second light-emitting devices OLED2 that are simultaneously driven may emit light having the same color. Accordingly, the second pixel Px2 may emit red light, green light, blue light, or white light, for example.

A space between the through portion H and the display region DA is the non-display area NDA'. In other words, the non-display region NDA' may surround a through portion H. In this case, the thin film encapsulation layer 300 may extend up to the non-display region NDA'.

The display apparatus 1 may further include a dam unit D' surrounding the through portion H, in the non-display region NDA'. Because the dam unit D' is the same as the dam unit D of FIG. 4, the dam unit D' may prevent the organic layer 320 of the thin film encapsulation layer 300 from flowing toward the through portion H.

In other words, the organic layer 320 faces or contacts a lateral surface of the dam unit D' facing the display region DA from among lateral surfaces of the dam unit D', and thus the organic layer 320 is prevented from moving toward, or into, the through portion H. On the other hand, the inorganic layers 310 and 330 may cover the dam unit D', and ends of the inorganic layers 310 and 330 may be closer to the through portion H than to the dam unit D'. At least one of the inorganic layers 310 and 330 may contact a lateral surface S of the substrate 100 that is exposed by the through portion H. Accordingly, in the non-display region NDA', edges of the inorganic layers 310 and 330 may be peeled off, and thus encapsulation characteristics of the thin film encapsulation layer 300 may be prevented from being weakened or removed.

Figure 9:
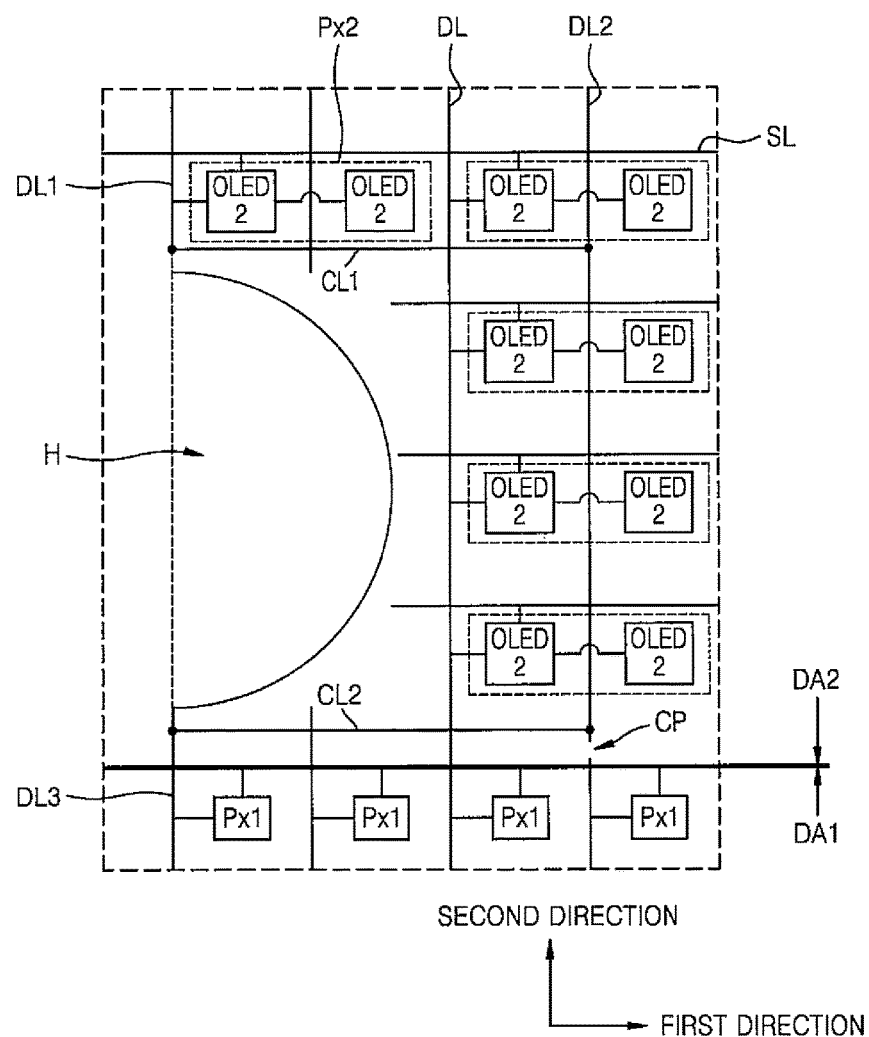
FIG. 9 is a magnified plan view of another example of the portion A of FIG. 2.

FIG. 9 is a magnified plan view of another example of the portion A of FIG. 2.

Referring to FIGS. 2 and 9, the plurality of data lines DL may include a first data line DL1 disconnected by at least one through portion H, and positioned within the second display region DA2, may also include a second data line DL2 continuously extending over the first display region DA1 and the second display region DA2, and may also include a third data line DL3 aligned with the first data line DL1 and disconnected from the first data line DL1 by the at least one through portion H.

Although FIG. 9 illustrates one first data line DL1, one second data line DL2, and one third data line DL3 for convenience of explanation, it should be understood that a plurality of first data lines DL1, a plurality of second data lines DL2, and a plurality of third data lines DL3 may be included.

The first data line DL1 is connected to a second pixel Px2. On the other hand, the second data line DL2 may be connected to first pixels Px1 within the first display region DA1, and might not be connected to any second pixel Px2 within the second display region DA2.

A first connection line CL1 may electrically connect the first data line DL1 to the second data line DL2, and a second connection line CL2 may electrically connect the second data line DL2 to the third data line DL3. Accordingly, the data signal applied to the third data line DL3 may be equally applied to the first data line DL1, and the second pixel Px2 connected to the first data line DL1 may normally emit light.

The first connection line CL1 and the second connection line CL2 may be formed at the same layer as the gate electrodes G1 and G2, the source and drain electrodes S1, S2, D1, and D2, or the second electrode CE2 of the storage capacitor Cst of FIG. 4.

When the first data line DL1 is electrically connected to the third data line DL3, the second data line DL2 may be cut off (e.g., may terminate) at a boundary between the first display region DA1 and the second display region DA2 (e.g., at a cut point CP) to prevent a short-circuit between the second data line DL2 and the third data line DL3.

Because the second data line DL2 is not connected to the second pixels Px2 within the second display region DA2, the cutting off of second data line DL2 at the boundary between the first display region DA1 and the second display region DA2 does not create any problems. Because a portion of the second data line DL2 to which no second data signals are applied due to the cutting is used as a passage for avoiding the through portion H, the area of the non-display region NDA' of FIG. 8 around the through portion H may be reduced or minimized, and manufacturing efficiency of the display apparatus 1 may improve.

Because the second pixels Px2 each include a plurality of second light-emitting devices OLED2 that are simultaneously driven and that emit light having the same color, resolution of the second display region DA2 may be lower than that of the first display region DA1.

Figure 10:
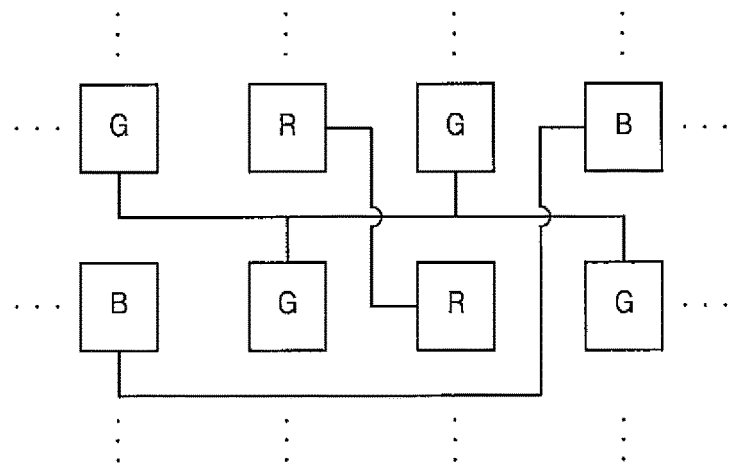
FIG. 10 is a plan view illustrating an example in which light-emitting devices are arranged within a display region of the display apparatus of FIG. 1.
Figure 11:
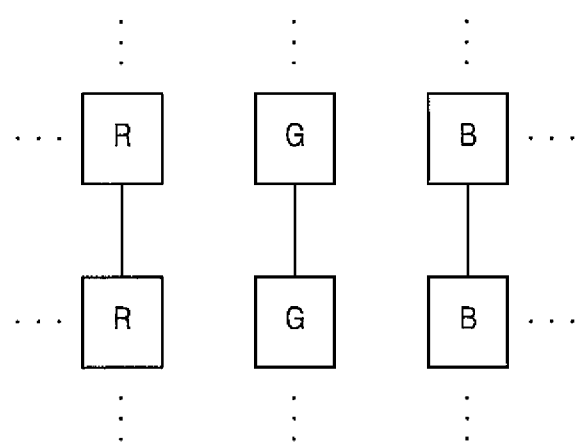
FIG. 11 is a plan view illustrating another example in which light-emitting devices are arranged within a display region of the display apparatus of FIG. 1.

FIGS. 10 and 11 are plan views illustrating examples in which light-emitting devices are arranged within the display region DA of the display apparatus 1 of FIG. 1.

FIG. 10 illustrates an example in which the light-emitting devices are arranged in a pentile manner. The arrangement manner of the light-emitting devices may be equally applied to the first display region DA1 of FIG. 1 and the second display region DA2 of FIG. 1.

Within the first display region DA1 of FIG. 1, one light-emitting device may be connected to one first pixel circuit C1 of FIG. 3 to form one first pixel Px1. On the other hand, within the second display region DA2 of FIG. 1, a plurality of light-emitting devices may be connected to one second pixel circuit C2 of FIG. 7. The plurality of light-emitting devices connected to the single second pixel circuit C2 of FIG. 7 may emit light having the same color.

For example, as shown in FIG. 10, when the light-emitting devices are arranged in a pentile manner, four green (G) light-emitting devices may be simultaneously driven by one second pixel circuit C2 of FIG. 7, two red (R) light-emitting devices may be simultaneously driven by another second pixel circuit C2 of FIG. 7, and two blue (B) light-emitting devices may be simultaneously driven by another second pixel circuit C2 of FIG. 7. Accordingly, the 8 light-emitting devices may be driven by the three second pixel circuits C2 of FIG. 7. However, embodiments of the present invention are not limited thereto, and the number of light-emitting devices simultaneously driven by one second pixel circuit C2 of FIG. 7 may vary in other embodiments. As another example, in the same pentile structure, two green light-emitting devices may be simultaneously driven by one second pixel circuit C2 of FIG. 7, while the other two green light-emitting devices may be simultaneously driven by another second pixel circuit C2. In other words, the 8 light-emitting devices may be driven by four second pixel circuits C2 of FIG. 7.

FIG. 11 illustrates an example in which the light-emitting devices are arranged in a stripe manner. In FIG. 11, two light-emitting devices that emit red light are connected to each other, two light-emitting devices that emit blue light are connected to each other, and two light-emitting devices that emit green light are connected to each other. In other words, 6 light-emitting devices are driven by three second pixel circuits C2 of FIG. 7. However, embodiments of the present invention are not limited thereto, and the number of light-emitting devices simultaneously driven by one second pixel circuit C2 of FIG. 7 may vary. As another example, when the light-emitting devices are arranged in the same stripe manner, four light-emitting devices that emit red light may be connected to one another, four light-emitting devices that emit blue light may be connected to one another, and four light-emitting devices that emit green light may be connected to one another.

Figure 12:
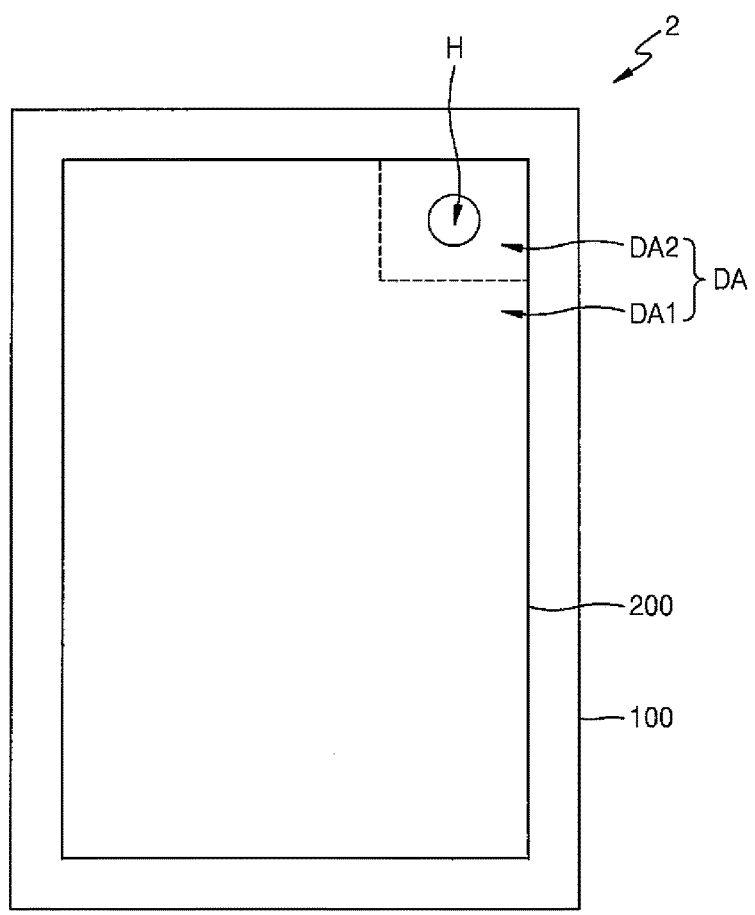
FIG. 12 is a schematic plan view of a display apparatus, which is a modification of the display apparatus of FIG. 1.

FIG. 12 is a schematic plan view of a display apparatus 2, which is a modification of the display apparatus 1 of FIG. 1.

A description of FIG. 12 that is the same as given above with reference to FIG. 1 will not be repeated herein, and only differences between the display apparatuses 1 and 2 respectively of FIGS. 1 and 12 will be described.

The display apparatus 2 of FIG. 12 may include the display unit 200 on the substrate 100, and the display unit 200 may include the display region DA including the first display region DA1 and the second display region DA2 having different resolutions. In the second display region DA2, at least one through portion H penetrating through the substrate 100 and the display unit 200 may be formed. Because some of the data lines in the second display region DA2 are not directly connected to any second pixel circuit C2 of FIG. 7 to be used as a passage for avoiding the through portion H, resolution of the second display region DA2 may be lower than that of the first display region DA1.

The second display region DA2 may have a reduced or minimized area that surrounds the through portion H. The areas of the second display region DA2 may vary according to the number of data lines disconnected by the through portion H. Accordingly, the display apparatus 2 of FIG. 12 may include the high-resolution first display region DA1 having an increased area.

A camera, a sensor, an LED, and the like may be mounted in the at least one through portion H. In other words, the camera, the sensor, the LED, and the like are arranged in the through portion H formed in the second display region DA2, the display region DA of the display apparatus 2 that displays an image may widen.

According to embodiments of the present invention, a through portion H in which a camera and the like may be mounted is positioned within a display region of a display apparatus, and thus the display region for displaying an image may widen.

Moreover, because data lines that extend over the through portion H do not need to have a curved shape in order to avoid the through portion H, the display apparatus may have a reduced non-display region around the through portion H and may provide improved manufacturing efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
    a substrate;
    a display unit on the substrate and comprising:
        a display region comprising:
            a first display region having therein a plurality of first pixel circuits, and a plurality of first light-emitting devices configured to be driven by the plurality of first pixel circuits; and
            a second display region having therein a plurality of second pixel circuits, and a plurality of second light-emitting devices configured to be driven by the plurality of second pixel circuits;
        a plurality of scan lines crossing the display region in a first direction; and
        a plurality of data lines crossing the display region in a second direction that is different from the first direction,
    wherein each of the plurality of first light-emitting devices and the plurality of second light-emitting devices comprises a pixel electrode and an intermediate layer comprising an organic emission layer on the pixel electrode,
    wherein a total number of the first light-emitting devices driven by one of the first pixel circuits is less than a total number of the second light-emitting devices driven by one of the second pixel circuits, and
    wherein the display unit and the substrate collectively define at least one through portion in the second display region.

2. The display apparatus of claim 1, wherein a number of the first light-emitting devices per unit area is equal to a number of the second light-emitting devices per unit area.

3. The display apparatus of claim 1, wherein the plurality of data lines comprise:
    a first data line disconnected at the at least one through portion in the second display region, and directly connected to the one of the second pixel circuits; and
    a second data line continuously extending over the first display region and the second display region, electrically connected to the first data line by a first connection line, and directly connected to the one of the first pixel circuits.

4. The display apparatus of claim 3, wherein the plurality of data lines further comprise a third data line aligned with the first data line, and separated from the first data line by the at least one through portion,
    wherein the second data line and the third data line are electrically connected to each other by a second connection line, and
    wherein a same data signal is applied to the first data line and the third data line.

5. The display apparatus of claim 4, wherein the second data line terminates at a boundary between the first display region and the second display region.

6. The display apparatus of claim 4, wherein each of the second pixel circuits comprises:
    a thin film transistor comprising:
        an active layer;
        a gate electrode;
        a source electrode; and
        a drain electrode, and
    a storage capacitor comprising:
        a second electrode; and a first electrode that comprises the gate electrode of the thin film transistor, and
wherein the first connection line and the second connection line are at a same layer as the gate electrode, the source electrode, the drain electrode, or the second electrode.

7. The display apparatus of claim 1, wherein at least two of the second light-emitting devices are simultaneously driven by one second pixel circuit, and
wherein the pixel electrodes of the at least two second light-emitting devices are electrically connected to each other.

8. The display apparatus of claim 7, wherein the intermediate layers of the at least two second light-emitting devices are configured to emit light having a same color.

9. The display apparatus of claim 1, wherein each of the first pixel circuits comprises a first thin film transistor,
wherein each of the second pixel circuits comprises a second thin film transistor, and
wherein a magnitude of a driving current of the first thin film transistor is different from a magnitude of a driving current of the second thin film transistor.

10. The display apparatus of claim 1, further comprising a thin film encapsulation layer that encapsulates the display unit, and that comprises at least one organic layer and at least one inorganic layer,
wherein the display unit comprises a non-display region at an edge of the at least one through portion to surround the at least one through portion, and
wherein the thin film encapsulation layer extends to the non-display region.

11. The display apparatus of claim 10, further comprising a dam unit that surrounds the at least one through portion at the non-display region,
wherein an end of the organic layer faces or contacts a lateral surface of the dam unit facing the display region,
wherein the inorganic layer covers the dam unit, and
wherein an end of the inorganic layer is closer to the at least one through portion than to the dam unit.

12. The display apparatus of claim 10, wherein the inorganic layer contacts a lateral surface of the substrate exposed by the at least one through portion.

13. A display apparatus comprising:
a substrate;
a display unit on the substrate, the substrate and the display unit collectively defining at least one through portion; and
a thin film encapsulation layer that encapsulates the display unit, and that comprises an organic layer and an inorganic layer,
wherein the display unit comprises:
a display region comprising first and second display regions having different resolutions;
a non-display region at an edge of, and surrounding, the at least one through portion; and
a dam unit within the non-display region and surrounding the at least one through portion,
wherein the organic layer faces or contacts a lateral surface of the dam unit that faces the display region, and
wherein the inorganic layer covers the dam unit, and contacts a lateral surface of the substrate exposed by the at least one through portion.

14. The display apparatus of claim 13, further comprising:
a plurality of first pixel circuits;
a plurality of first light-emitting devices configured to be driven by the plurality of first pixel circuits in the first display region,
a plurality of second pixel circuits; and
a plurality of second light-emitting devices configured to be driven by the plurality of second pixel circuits in the second display region,
wherein a number of first light-emitting devices driven by one of the first pixel circuits is less than a number of second light-emitting devices driven by one of the second pixel circuits.

15. The display apparatus of claim 14, wherein the at least one through portion is in the second display region.

16. The display apparatus of claim 14, wherein the display unit further comprises:
a plurality of scan lines crossing the display region in a first direction; and
a plurality of data lines crossing the display region in a second direction that is different from the first direction,
wherein the plurality of data lines comprise:
a first data line in the second display region and disconnected at the at least one through portion; and
a second data line continuously extending over the first display region and the second display region, and
wherein the first data line and the second data line are electrically connected to each other by a first connection line.

17. The display apparatus of claim 16, wherein the first data line is directly connected only to the one of the second pixel circuits, and
wherein the second data line is directly connected only to the one of the first pixel circuits.

18. The display apparatus of claim 17, wherein the plurality of data lines further comprise a third data line aligned with the first data line, and separated from the first data line by the at least one through portion,
wherein the second data line and the third data line are electrically connected to each other by a second connection line, and
wherein the second data line terminates at a boundary between the first display region and the second display region.

19. The display apparatus of claim 18, wherein each of the plurality of second pixel circuits comprises a thin film transistor comprising:
an active layer;
a gate electrode;
a source electrode; and
a drain electrode, and
wherein the first connection line and the second connection line are at a same layer as the active layer, the gate electrode, the source electrode, or the drain electrode.

20. The display apparatus of claim 16, wherein each of the plurality of second light-emitting devices comprises a pixel electrode, and an intermediate layer comprising an organic emission layer on the pixel electrode,
wherein at least two of the plurality of second light-emitting devices are simultaneously driven by one second pixel circuit, and
wherein the pixel electrodes of the at least two second light-emitting devices are electrically connected to each other.

21. The display apparatus of claim 20, wherein the intermediate layers of the at least two second light-emitting devices are configured to emit light having a same color.

22. The display apparatus of claim 14, wherein each of the first pixel circuits comprises a first thin film transistor, wherein each of the second pixel circuits comprises a second thin film transistor, and
wherein a magnitude of a driving current of the first thin film transistor is different from a magnitude of a driving current of the second thin film transistor.

\* \* \* \* \*